United States Patent [19]

Cohen

[11] Patent Number: 5,059,927

[45] Date of Patent: Oct. 22, 1991

[54] MICROWAVE OSCILLATOR WITH REDUCED PHASE NOISE

[75] Inventor: Leonard D. Cohen, Brooklyn, N.Y.

[73] Assignee: Ail Systems, Inc., Deer Park, N.Y.

[21] Appl. No.: 534,735

[22] Filed: Jun. 7, 1990

Related U.S. Application Data

[63] Continuation of Ser. No. 399,774, Aug. 28, 1989, Pat. No. 4,973,921.

[51] Int. Cl.⁵ ............................................. H03B 9/12
[52] U.S. Cl. ................................ 331/77; 331/96; 331/107 DP; 331/107 G; 331/177 V
[58] Field of Search ................ 331/74, 76, 77, 96, 331/107 DP, 107 SL, 107 C, 107 G, 117 D, 177 V

[56] References Cited

U.S. PATENT DOCUMENTS

| 4,025,881 | 5/1977 | Cohen et al. | 333/98 R |
| 4,246,550 | 1/1981 | Cohen | 331/107 DP |
| 4,728,907 | 3/1988 | Cohen | 331/107 R |

OTHER PUBLICATIONS

"1990 Millimeter Wave Products", Hughes Aircraft Co., Microwave Products Division, 3100 Fujita St., P.O. Box 2940, Torrance, Calif. 90509-2940, printed Jun. 1989.
"A High Q Cavity Stabilized Gunn Oscillator at 94 GHz", H. Barth, IEEE MTT-S International Microwave Symposium Digest, IEEE Catalog 86CH2301-0, ISSN0149645X, pp. 179-182, Jun. 1986.
"26 to 60 GHz Channelized Receiver Meets Surveillance Requirements", P. Meier et al, Microwave System News, Dec. 1981, pp. 60-80.
"Microwave Oscillator Noise Reduction by a Transmission Stabilizing Cavity", J. R. Ashley & C. Searles, IEEE Trans. MTT, vol. MTT-16, No. 9, Sep. 1968, pp. 743-748.
"Loaded Q Factor Measurements on Gunn Oscillators", Warner & Hobson, Microwave Journal, Feb. 1970, pp. 46-53.
"Wide Range Tuning of Solid State Microwave Oscilla-tors", D. Cawsey, IEEE Journal of Solid State Circuits, Apr. 1970, pp. 82-84.
"Injection Locking of Microwave Solid State Oscillators", K. Kurokawa, Proceedings of the IEEE vol. 61, No. 10, Oct. 1973, pp. 1386-1410.
"Microwave Oscillator Circuits", S. Hamilton, Microwave Journal, Apr. 1978, pp. 63-66 and 84.
"FM and AM Noise in Microwave Oscilators", S. Hamilton, Microwave Journal, Jun. 1978, pp. 105-109.
Phaselock Techniques, F. Gardner, John Wiley & Sons, New York, 1979, pp. 1-7, 72.
"Varactor Tuned Gunn Oscillators with Wide Tuning Range for the 25 to 75 GHz Frequency Band", L. Cohen, IEEE-MIT-S Int'l Microwave Symposium, Apr. 1979, pp. 1-3.
"A Wideband, Backshort-Tunable Second Harmonic W-Band Gunn-Oscilator", H. Barth, 1981 IEEE MTT-S Symposium Digest, pp. 334-337.

(List continued on next page.)

Primary Examiner—Siegfried H. Grimm
Attorney, Agent, or Firm—Andrus, Sceales, Starke & Sawall

[57] ABSTRACT

An oscillator operational in the millimeter wave and microwave range, including frequencies greater than 60 GHz, is provided with reduced phase noise by enhancing Q of the resonant circuitry by reactively terminating fundamental frequency oscillation and increasing stored fundamental frequency energy in the resonant circuitry. A two frequency system is provided with constructive reflection of energy at fundamental frequency back to the resonant circuitry, and with isolation of fundamental frequency energy from the output load. Energy to the output load is obtained from the in-situ generated second harmonic of the active element. Phase noise is reduced by enhancing Q by more than an order of magnitude.

26 Claims, 6 Drawing Sheets

"Stabilization of a W-Band Microstrip Oscillator By A Dielectric Resonator", G. Morgan, Electronic Letters, Jun. 24, 1982, vol. 18, No. 13, pp. 556-558.

*Microwave Receivers and Related Components*, J. Tsui, Air Force Wright Aeronautical Laboratories, Library of Congress Cat. #83-600566, 1983, p. 482.

"Active Phase Shifters for The Millimeter and Microwave Bands", L. Cohen, 1984 IEE MTT-S Digest, pp. 397-399.

"Wideband Electronically Tunable GaAs Gunn VCO's at W-Band (75-110 GHz)", J. Ondria, 1985 IEEE MTT-S Symposium Digest, pp. 375-378.

"Frequency/Temperature Compensated Millimeter-Wave Oscillators and Broadband VCO's In Lumped-Element and Printed-Circuit Forms", L. Cohen, et al, IEEE MTT-S International Microwave Symposium Digest, 1986, pp. 169-172.

Avantek Product Guide Catalog, 1987, p. 67.

"Recent Advances in the Modelling and Performance of Millimeter Wave InP and GaAs Gunn VCO's and Oscilators", L. Cohen and E. Sard, IEEE-MTT-S International Microwave Symposium Digest, 1987, pp. 429-432.

"4 to 40 GHz Even Harmonic Schottky Mixer", J. Merenda et al, 1988 IEEE MTT-S International Microwave Symposium Digest, pp. 695-698.

"CMW Series Wideband Electronically-Tuned Gunn Oscillators", Central Microwave Company, Maryland Heights, Mo., Jun. 1988.

"Millimeter Wave, Lumped Element, Gunn VCO's With Ultrawide-Band (20 GHz) Tuning", L. Cohen and E. Sard, 1989 IEEE-MTT-S International Microwave Symposium, Jun. 13-15, 1989, pp. 1927-1930.

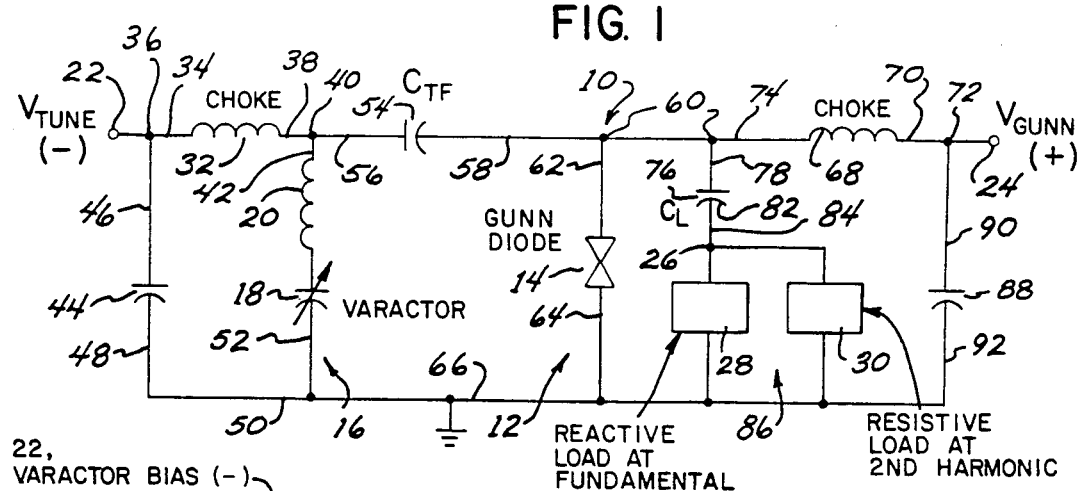
FIG. 1
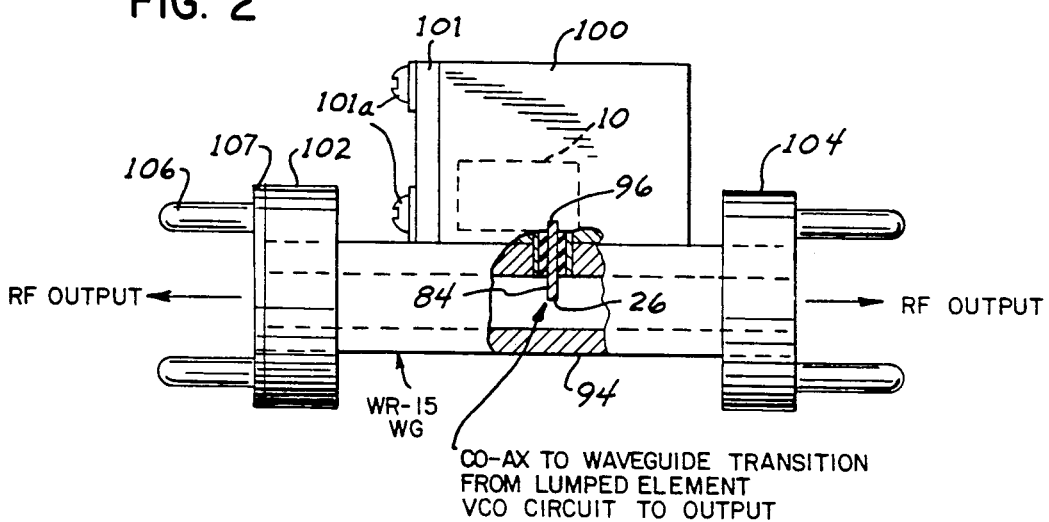
FIG. 2
FIG. 4
FIG. 3

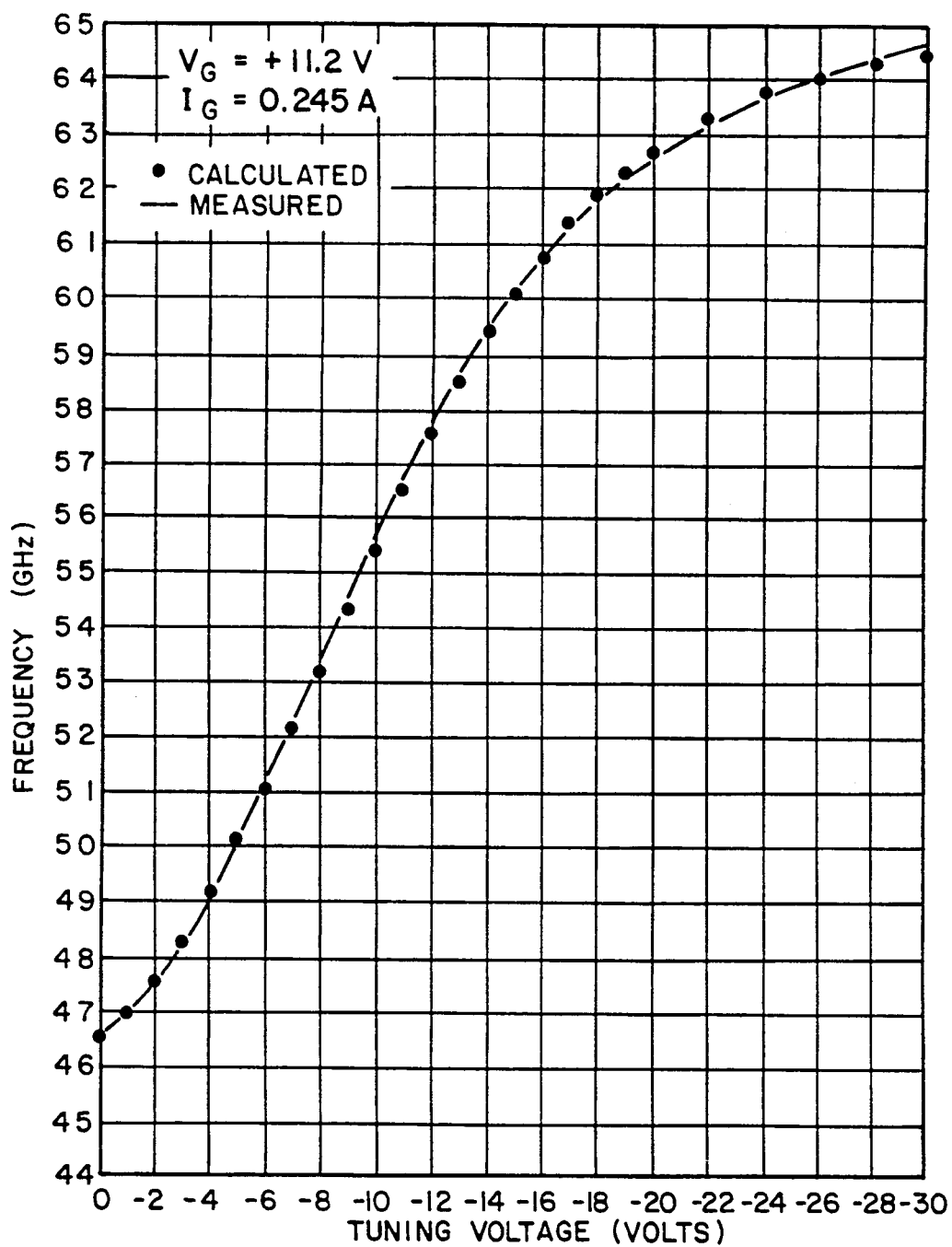
FIG. 6 CALCULATED AND MEASURED TUNING CHARACTERISTICS OF SECOND HARMONIC, LUMPED ELEMENT, GUNN VCO

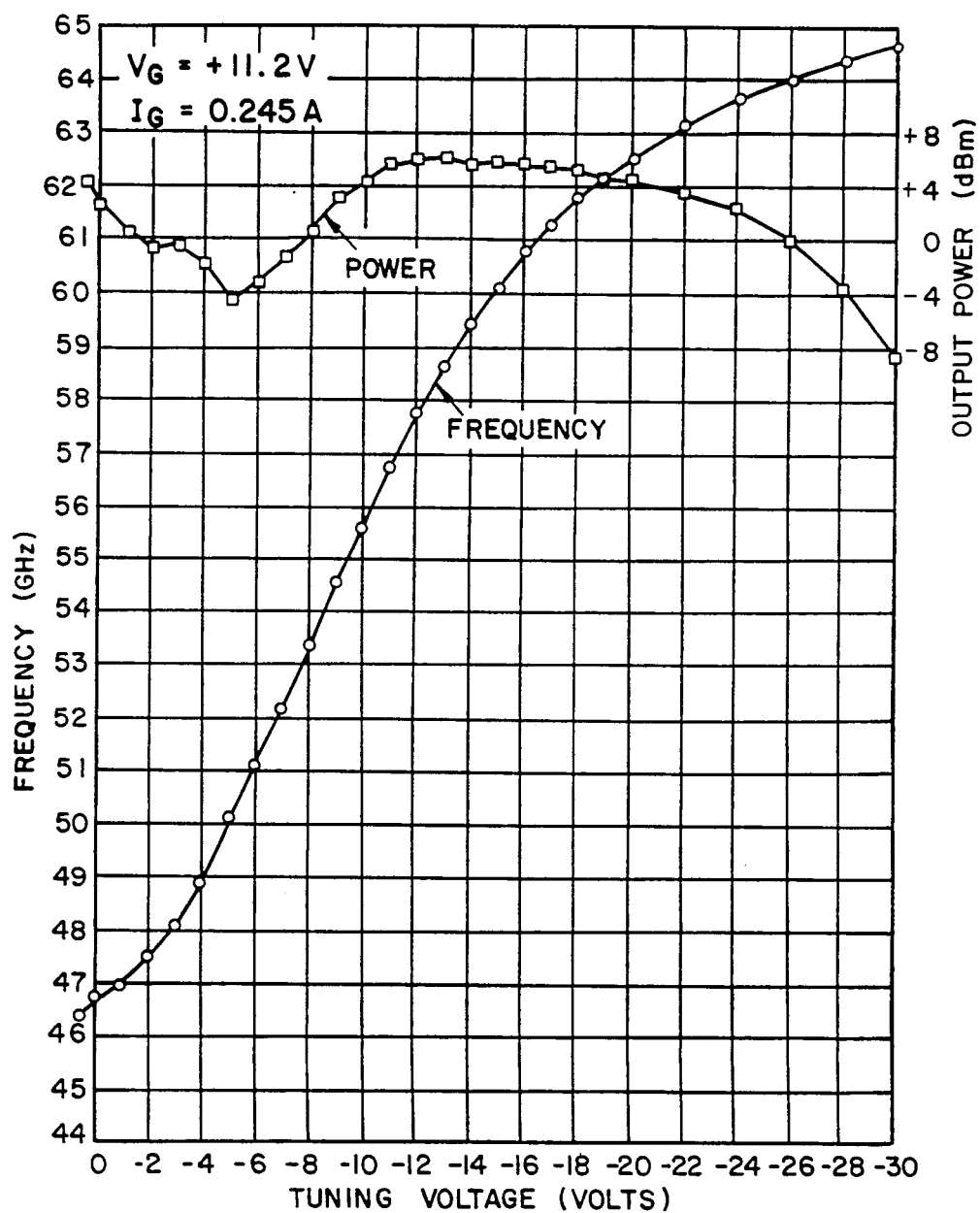
FIG. 7 MEASURED PERFORMANCE OF SECOND HARMONIC, LUMPED ELEMENT, GUNN VCO

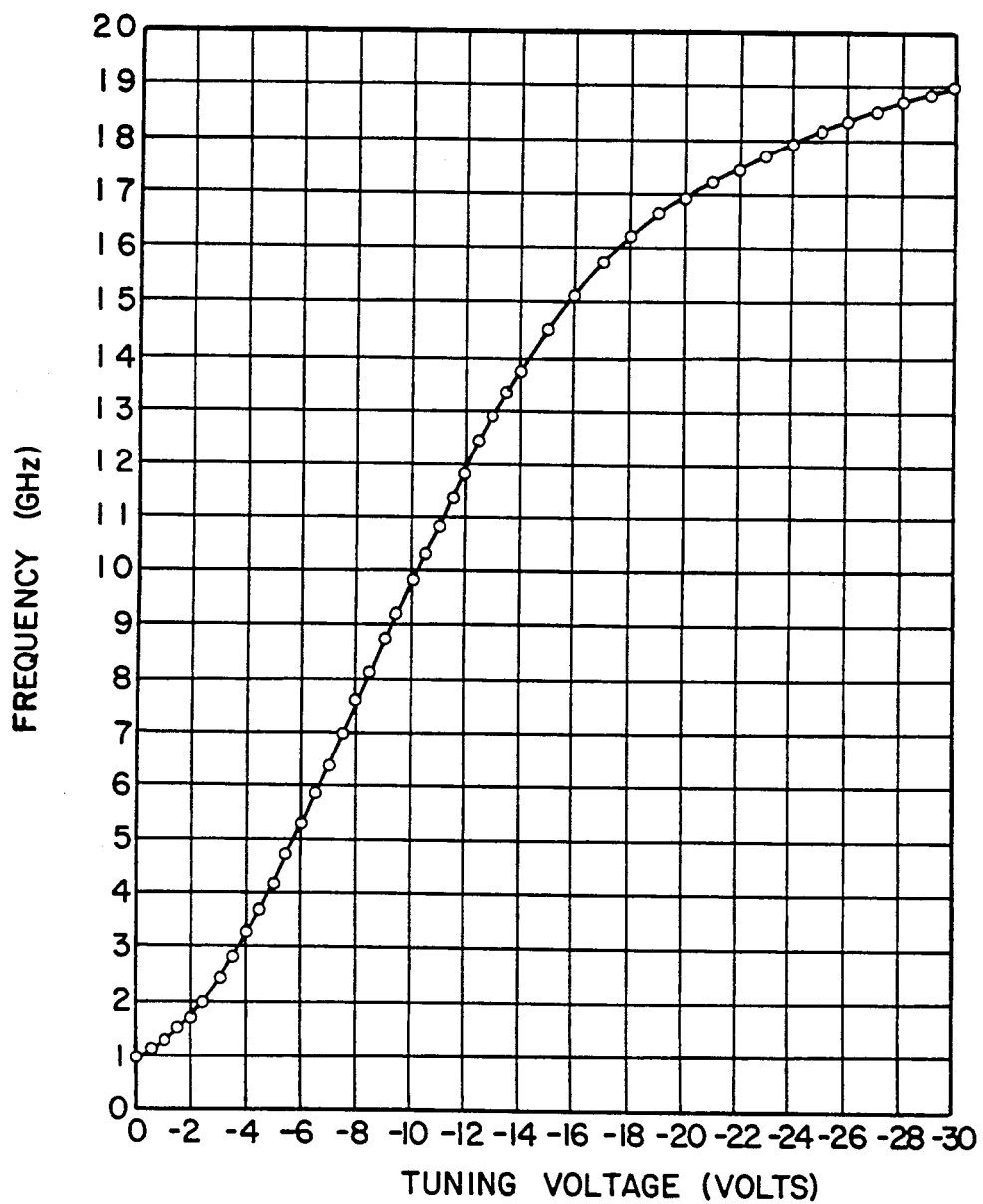
FIG. 10 MEASURED PERFORMANCE OF MULTIOCTAVE MICROWAVE VCO
MM WAVE VCO DOWNCONVERTED WITH 45.69 GHz LO

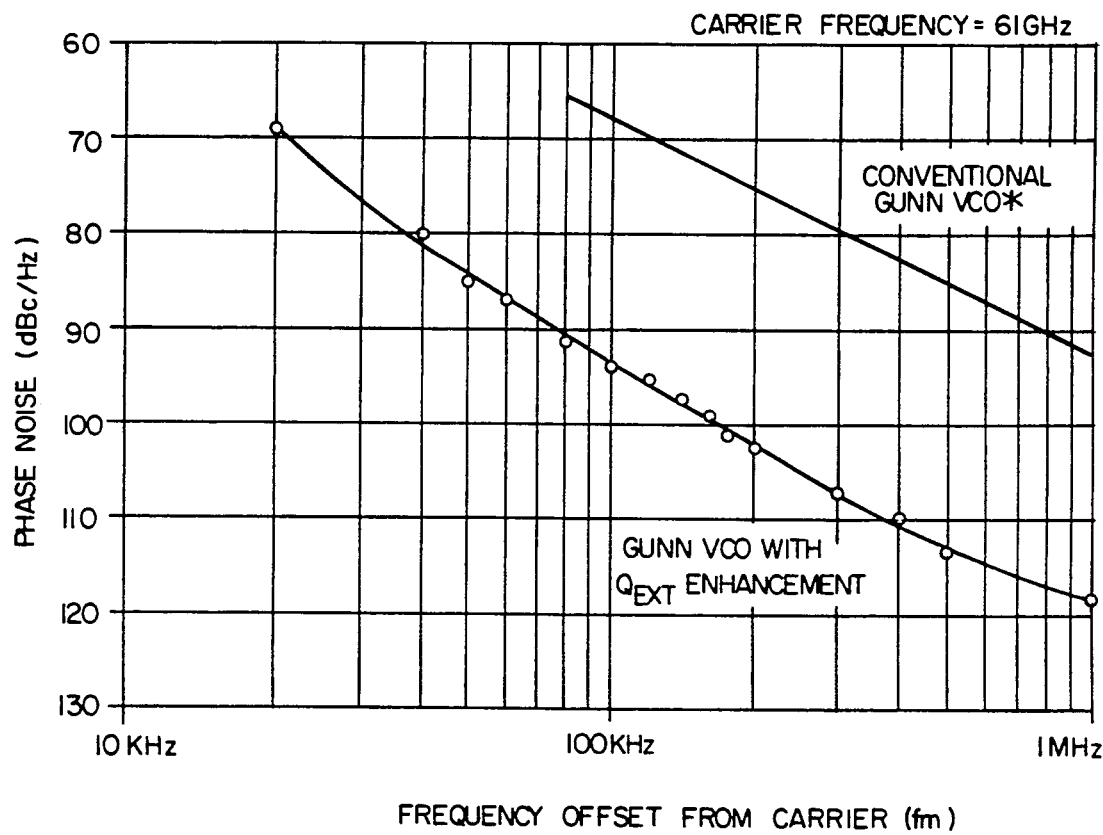
FIG.11   MEASURED PHASE NOISE OF LUMPED ELEMENT
GUNN VCO WITH AND WITHOUT $Q_{EXT}$ ENHANCEMENT
∗ EXTRAPOLATED FROM MEASUREMENTS AT 35 GHz

MICROWAVE OSCILLATOR WITH REDUCED PHASE NOISE

CROSS REFERENCE TO RELATED APPLICATION

This application is a continuation-in-part of application Ser. No. 07/399,774, filed Aug. 28, 1989 and issued as U.S. Pat. No. 4,973,921.

BACKGROUND AND SUMMARY

PARENT APPLICATION

The parent invention relates to a millimeter wave, lumped element, varactor tuned oscillator, VCO. A VCO is an oscillator whose output frequency is electronically controlled. In solid state VCO's, the electronic tuning capability is provided by a voltage controlled capacitive element, a varactor diode, that is an integral part of the VCO circuit. The magnitude of the frequency change that can be produced in the VCO is a function of the maximum to minimum capacitance ratio of the varactor and the undesired padding effect (reduction) on the varactor capacitance ratio by other capacitive elements in the circuit, including circuit and diode package parasitics. In an ideal situation, the varactor would be the only capacitive energy storing element in the circuit, and hence it would have maximum control of the VCO tuning range. In addition to the capacitance ratio of the varactor, the output (resistive) loading is another factor that reduces VCO tuning range. The effect of resistive loading, when transformed to the terminals of the VCO active element, is to decrease the effective capacitance ratio of the varactor. Hence, a load should be lightly coupled to a VCO when maximum tuning range is a performance objective. These basic considerations in wide band tuning of a Gunn VCO have resulted in a maximum tuning range of 7% of center frequency, a ±2 GHz (gigahertz) tuning band at a center frequency of 57.5 GHz, in commercially available waveguide (distributed circuit) type VCO's, "CMW Series Wideband Electronically-Tuned Gunn Oscillators", Central Microwave Company, Maryland Heights, Mo., June 1988.

The parent invention provides an ultrawideband, lumped element, varactor tuned millimeter wave VCO. In one embodiment, the VCO has a ±10 GHz tuning band at a center frequency of 56 GHz, which 20 GHz tuning band (35.7% range) is five times the tuning range available with existing Gunn VCO's in the same frequency band.

PRESENT INVENTION

The present invention relates to oscillators, including varactor tuned oscillators (VCO's), operational in the millimeter wave and microwave range including frequencies greater than 60 GHz, and more particularly to reduction of phase noise.

Phase noise on signal sources used as transmitters and receiver local oscillators in communication and radar systems can cause a degradation in system sensitivity and selectivity. In a digital communication system, for example, phase noise close to the carrier affects the system bit-error rate. In analog communication systems, modulation information exists at least several hundred KHz from the carrier. As an incoming signal is successively amplified in passing through several repeater stations, usually in a down-up frequency conversion process, local oscillator phase noise is cumulatively translated to the signal. The effect of the added phase noise at the receiving end of multiple repeaters is to degrade the signal to noise ratio and therefore system sensitivity. Phase noise on both the transmitter and local oscillator sources in a Doppler radar system sets a detection limit on Doppler shifted target returns in the presence of a large clutter return signal that is close in frequency to the target return. Hence, low phase noise is an important performance characteristic of transmitter and local oscillator sources that are used in communication and radar systems.

The importance of low phase noise in signal sources has made phase noise reduction techniques a foremost need. A commonly used technique to reduce the phase noise of a microwave or millimeter wave voltage tunable oscillator (VCO) is to phase lock the oscillator to an ultra-stable reference source such as a crystal or surface acoustic wave (SAW) oscillator, *Phaselock Techniques*, F. Gardner, John Wiley & Sons, 1979. The phase locked loop functions in effect as a phase noise filter. It is a low pass filter with respect to noise of the reference signal and a high pass filter with respect to the noise of the VCO. Within the phase lock loop bandwidth, the VCO will exhibit the low phase noise character of the reference source. Outside the loop bandwidth, the VCO will exhibit its own phase noise as a free running VCO. Phase locking is accomplished by comparing the phase of the reference signal against the phase of the VCO output. A difference in phase generates an error signal which is used to retune the VCO so as to minimize the phase difference (error signal) between the reference signal and the VCO.

Another technique commonly used for phase noise reduction in microwave and millimeter wave oscillators is injection locking, "Injection Locking of Microwave Solid State Oscillators", K. Kurokawa, IEEE Vol. 61, No. 10, October 1973, pp. 1386-1410. In injection locking, a stable RF signal at oscillator frequency, or at a subharmonic of oscillator frequency, is derived from an ultra-stable reference source and is injected into the RF port of the oscillator to be locked. With a sufficient level of injected power, the oscillator will lock to the frequency of the injected stable signal. Within the locking bandwidth, the oscillator will exhibit the low phase noise character of the injected stable signal Outside the locking bandwidth, the oscillator will exhibit its own free running phase noise characteristic. Both the injection locking and phase locking techniques require their own signal sources and a significant amount of complementary circuitry for implementation of these phase noise reduction techniques.

Another known technique that is used for phase noise reduction in an oscillator is to stabilize the oscillator with a high Q narrow band filter. This technique has practical limitations at millimeter wave frequencies because it is difficult to realize the high Q value and narrow filter passband that are required for meaningful phase noise reduction. For example, dielectric resonator (filter) type oscillators (DRO's) are limited in practice to approximately 26 GHz by Q value considerations. The unloaded Q of a 6 GHz dielectric resonator is 7000, *Microwave Receivers and Related Components*, J. Tsui, Air Force Wright Aeronautical Laboratories, Library of Congress cat. #83-600566, whereas the measured Q of a dielectric resonator at 86 GHz is only 420, "Stabilization of a W-Band Microstrip Oscillator by a Dielectric Resonator", G. Morgan, Electronic Letters, June 24, 1982, Vol. 18, No. 13, pp. 556-558. The decrease of Q with frequency follows the decrease in the volume to surface area ratio of the resonator with increasing frequency. Resonator size at 86 GHz was only 0.032×0.032×0.0068 inches. Phase noise reduction by use of a dielectric resonator in an oscillator follows from the high Q resonator functioning as the main energy storing element in the oscillator. The stabilizing effectiveness of the dielectric resonator is reflected in the ratio of the resonator Q to the Q of the free running oscillator. In the 86 GHz oscillator (DRO) cited, the stabilizing factor was only 6 which is insufficient to produce meaningful phase noise reduction, "Microwave Oscillator Noise Reduction by a Transmission Stabilizing Cavity", J. R. Ashley and C. Searles, IEEE Trans. MTT, Vol. MTT-16, No. 9, Sept. 1968, pp. 743-748.

Another example of phase noise reduction by use of the narrow-band filter technique is based on the use of an yttrium iron garnet (YIG) sphere, *Microwave Receivers and Related Components*, J. Tsui, Air Force Wright Aeronautical Laboratories, Library of Congress cat. #83 -600566. When immersed in a proper magnetic field, the YIG sphere will act as a current tunable bandpass filter or as a tunable microwave cavity, with a Q factor on the order of 1000 to 8000. YIG tuned oscillators and filters are practical to an upper frequency of about 40 GHz. The tunable YIG filter, when used as the frequency determining element in an oscillator or when used as a filter external to the oscillator, will reduce the phase noise of an oscillator over a wide frequency range. However, its effectiveness in reducing close in oscillator phase noise is limited by its wide bandwidth which ranges from 10 MHz to several hundred MHz. Its high insertion loss, which ranges from a few dB to 10 dB, slow tuning speed (milliseconds) as compared to fast tuning speed (microseconds) of a varactor tuned oscillator and its relatively wide passband are disadvantages in a phase noise reduction application.

The invention disclosed herein describes a technique for the reduction of the phase noise of microwave and millimeter wave fixed frequency oscillators and wideband voltage tuned oscillators (VCO's) by a simple circuit means that is an integral part of the oscillator or VCO circuit. No components or reference sources external to the oscillator or VCO are required. Demonstrated performance of a Gunn VCO stabilized with the disclosed technique was comparable in phase noise level to that of a commercial Gunn VCO stabilized by the phase lock loop technique at frequencies 50 KHz to greater than 1 MHz from the carrier. It is simpler, smaller, and lower cost than the phase or injection locking techniques. It is inherently more broadband and has faster tuning speed than the basically narrow-band, slow and significantly more complex phase locking technique. It is usable at much higher frequencies than is practical for phase noise reduction by known use of a narrow-band filter or cavity.

In one desirable aspect, the invention provides continuous phase noise reduction over the broad tunable frequency range of a VCO, i.e. a VCO covering the full WR-19 waveguide band of 40 to 60 GHz. The phase noise reduction circuitry is fixed and does not require any adjustments over the continuously tunable broad frequency range of the VCO. This feature is in contrast to the injection locking technique which is basically a narrow-band technique and which requires a change in injected signal frequency for each change in VCO frequency. It is also in contrast to the phase locked loop technique which also is a basically narrow-band technique and which requires electronic adjustment of the phase lock circuitry (i.e. digital dividers and multipliers) to accommodate each frequency on the tuning range of the VCO. In addition, a phase locked loop system for a broadband frequency tunable VCO is only piece-wise continuous on the tuning range of the VC With the disclosed technique, VCO output with its reduced phase noise is fully continuous on the VCO tuning range.

In another desirable aspect, the disclosed phase noise reduction technique uses a high pass filter rather than a bandpass filter as required with conventional filter type phase noise reduction techniques The frequency range of use of the disclosed technique is thereby made practical at millimeter wave frequencies significantly higher than the upper frequency limit for the known narrow passband filter technique used for phase noise suppression. The filter technique for phase noise suppression is practical to 26 GHz with dielectric resonator filters and 40 GHz with YIG filters whereas the disclosed technique has been demonstrated at 61 GHz and is usable to greater than 100 GHz. The higher frequency range of use with the disclosed technique follows from the use of a high-pass filter, for example, a section of waveguide with appropriate cutoff frequency, rather than a high Q resonator or bandpass filter. In the filter noise reduction technique, high Q is a foremost requirement since the filter serves as a primary energy storing and frequency determining element. The Q value of the narrowband filter or resonator determines the degree by which the oscillator is stabilized. In the disclosed technique, the high-pass filter serves a different function, namely to provide a large broadband reactance below its cutoff frequency and to transmit the desired output in its passband. It is not used as a primary energy storing or frequency determining element. The conventional bandpass filter phase noise reduction technique is impractical and ineffective at millimeter wavelengths due to the diminishing effort of frequency on filter or resonator size and Q factor. For example, a dielectric resonator at 86 GHz, "Stabilization of a W-Band Microstrip Oscillator by a Dielectric Resonator", G. Morgan, Electronic Letters, June 24, 1982, Vol. 18, No. 13, pp. 556-558, is only 0.032×0.032×0.0068 inches. By contrast, a high-pass filter, as used in the disclosed technique, for an output at 86 GHz is much larger and is simply a section of commercially available WR-12 waveguide (0.202×0.141 inches outside dimensions). Commercial waveguide is available to 300 GHz.

In another desirable aspect, the disclosed noise reduction technique results in a low noise oscillator that is simpler, significantly smaller and lower cost than realizable with the phase locking or injection locking noise reduction techniques. The demonstrated V band (50 to 75 GHz) noise reduced Gunn VCO had a volume of 0.75 in$^3$ as contrasted to a volume of 82 in$^3$ for a commercially available phase locked Gunn oscillator at the same frequency.

In another desirable aspect, the tuning speed of the VCO (microseconds) is not diminished by the use of the phase noise reduction technique. This is in contrast to the phase locking and injection locking techniques which require a time interval (milliseconds) for phase or injection lock to be achieved. It is also in contrast to a YIG tuned filter whose tuning speed is at least an order of magnitude slower than a VCO using the disclosed phase noise reduction technique.

In another desirable aspect, the disclosed noise reduction technique is based on circuitry that enhances the external Q of the oscillator or VCO. The phase noise of the oscillator or VCO varies inversely with the square of its external Q, "FM and AM Noise in Microwave Oscillators", S. Hamilton, Microwave Journal, June 1978, pp. 105-109. External Q ($Q_{ext}$) is the ratio of the energy stored in the resonator circuit to the energy dissipated in the load. In the disclosed technique, a high-pass filter separates the fundamental tuning circuit of the VCO or oscillator from the second harmonic of the oscillation that is the output delivered to the load. The high-pass filter reactively terminates the fundamental tuning circuit thereby providing a high level of stored energy in the fundamental resonator circuit. The resonator circuit is the prime energy storing and frequency determining circuit. The high pass filter is at a sufficiently high reactance level that it is not an oscillation frequency determining element or major energy storing element. By contrast, in oscillators whose phase noise is reduced by use of a dielectric or YIG resonator type oscillator circuit (or external filter), the dielectric or YIG resonator is a primary energy storing and oscillation frequency determining element. The phase noise reduction function is primarily determined by the characteristics of the distinct dielectric of YIG resonator (or external filter). In the disclosed technique, a separate and distinct resonator is not used. Phase noise reduction is accomplished by enhancement of the Q of the existing VCO or oscillator resonator circuit by reactively terminating the fundamental oscillation. Since the reactive termination is broadband, Q enhancement and attendant phase noise reduction is over the full tuning range of the varactor tuned VCO. By contrast, a dielectric resonator oscillator is not widely tunable due to the fixed frequency of its frequency determining dielectric resonator.

BRIEF DESCRIPTION OF THE DRAWINGS

FIG. 1 is a circuit diagram showing a VCO circuit constructed in accordance with the invention.

FIG. 2 shows the physical layout of the circuitry of FIG. 1.

FIG. 3 shows the circuit of FIG. 2 coupled to an output waveguide.

FIG. 4 is an end view of a portion of FIG. 3.

FIG. 6 is a graph showing tuning characteristics of a VCO in accordance with the invention.

FIG. 7 is a graph showing performance of a VCO in accordance with the invention.

FIG. 10 is a graph showing tuning characteristics of a multi-octave VCO system in accordance with FIG. 8.

FIG. 11 is a graph showing phase noise reduction in accordance with the invention.

DETAILED DESCRIPTION

PARENT APPLICATION

Figure 5:
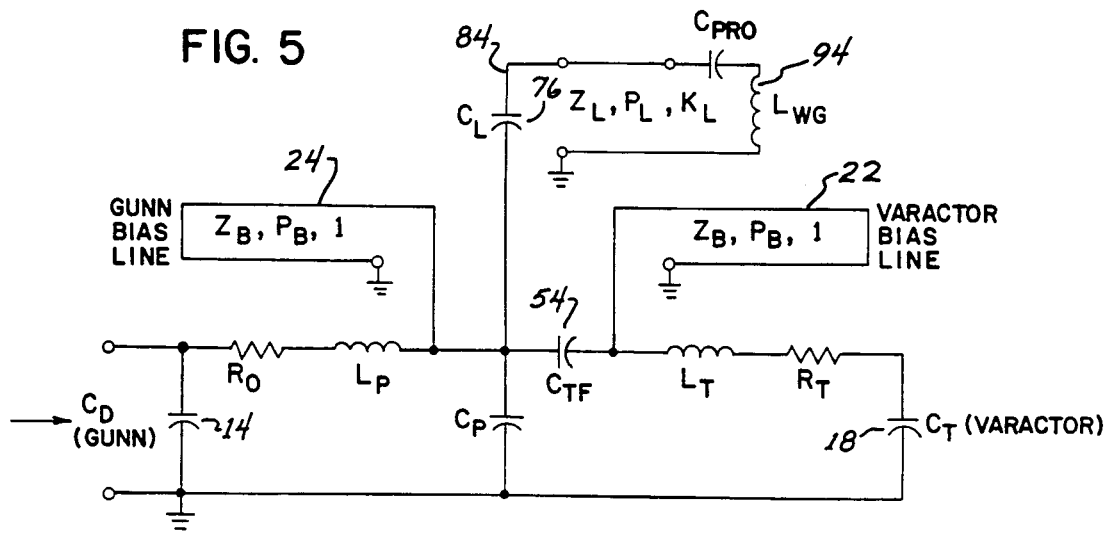
FIG. 5 shows the equivalent circuit model of the second harmonic, varactor tuned, lumped element, Gunn oscillator of FIGS. 1 and 2.

FIG. 1 is a circuit diagram showing a varactor tuned oscillator, VCO, operational in the millimeter wave range including frequencies greater than 30 GHz in accordance with the invention, and FIG. 2 shows the packaged form in a 0.074 inch square package. Oscillator 10 includes a lumped element active circuit 12 including an active element 14, such as a Gunn or Impatt diode, FET, etc. The oscillator includes a lumped element tuning circuit 16 coupled to active circuit 12 and providing resonant circuitry in combination therewith. Tuning circuit 16 includes a varactor diode 18 and inductance 20. The lumped element circuit concept is based on the use of the circuit elements that are sufficiently small (electrically), that they are functionally characterized as lumped elements. Inductive element 20 is a short length of line that provides the electrical connection between discrete components. A first bias port 22 is provided for varactor tuning, and a second bias port 24 is provided for biasing active element 14. Output 26 of the VCO is reactively terminated by load 28 at the fundamental frequency of oscillation, and is resistively loaded by load 30 at the second order harmonic, or other higher order harmonic.

A first quarter wave choke 32 at ≦second order harmonic has a first terminal 34 connected at node 36 to bias port 22, and a second terminal 38 connected at node 40 to a first terminal 42 of tuning circuit 16. A low pass RF bypass filter is provided by a chip capacitor 44 having a first terminal 46 connected to node 36, and a second terminal 48 connected to ground at return conductor 50 which is also connected to the second terminal 52 of tuning circuit 16. Tuning circuit 16 is coupled to active circuit 12 by a DC blocking capacitor 54 having a first terminal 56 connected at node 40 to first terminal 42 of tuning circuit 16, and having a second terminal 58 connected at node 60 to first terminal 62 of active circuit 12. Second terminal 64 of active circuit 12 is connected through ground return reference 50 to second terminal 52 of tuning circuit 16. Quarter wave choke 68 at ≦second order harmonic has a first terminal 70 connected at node 72 to bias port 24, and a second terminal 74 connected at node 60 to first terminal 62 of active circuit 12. VCO output 26 is capacitively coupled to active element 14 by Capacitor 76 having a first terminal connected to node 60 between terminal 74 of choke 68 and terminal 62 of active circuit 12, and a second terminal 82 coupled through conductor 84 to load circuit 86. A low pass RF bypass filter is provided by a chip capacitor 88 having a first terminal 90 connected to node 72 and a second terminal 92 connected through ground return reference 50 to second terminal 64 of active circuit 12.

Load circuit 86 is an output waveguide 94, FIG. 3, for example a WR-15 waveguide cutoff at fundamental frequency and propagating the second order harmonic. Output conductor 84 couples the active element of the VCO to load circuit 86. Conductor 84 has a first end 96, FIG. 2, at first terminal 62 of active circuit 12, and a second end 26 at load circuit 86. End 26 is within waveguide 94. Capacitor 76 is connected between end 96 of conductor 84 and terminal 62 of active circuit 12. In one embodiment, conductor end 96 is spaced from terminal by an air gap therebetween, and capacitor 76 is provided by such air gap. The VCO circuitry is enclosed within housing cover 100 mounted on waveguide 94 and closed by a cover 100 mounted to the housing by screws 101a. The waveguide is a standard part, and has circular end flanges 102 and 104 with dowel pins such as 106 extending therefrom. Flange 102 has a disc 107 thereon with a circular aperture 108, FIG. 4, through which the RF output propagates from the waveguide 94. As is standard, disc 107 has dowel pin clearance holes 107a and screw holes 107b. Disc 107 with aperture 108 allows sampling of a portion of the energy. In a further embodiment, disc 107 is replaced with a solid non-apertured disc which is nominally a quarter wavelength from conductor 84 and constructively reflects energy rightwardly, FIG. 3, to the right output port. The invention provides a VCO having a demonstrated tuning range of 35.7%, a ±10 GHz tuning band at a center frequency of 56 GHz, which is 5 times the tuning range available with existing Gunn VCO's in the same frequency band. The enhanced tuning capability with the disclosed VCO follows from the following aspects of its design.

(1) A lumped element circuit form is used which is inherently more broadband than a distributed circuit.

(2) A lumped element circuit form is used which inherently minimizes circuit parasitics, and hence the diminishing effect on varactor capacitance ratio due to the parasitics.

(3) A VCO circuit is tuned at fundamental frequency with output obtained from the in-situ generated second harmonic, or higher order harmonic, of the active element, such as a Gunn diode, Impatt diode, etc. The in-situ harmonic generation eliminates the need for a separate broadband doubler circuit.

(4) A VCO circuit is varactor tuned at fundamental frequency with the fundamental oscillator circuit reactively terminated. A reactive termination on the tunable fundamental oscillation band has the desirable effect of eliminating the diminishing effect on the tuning range of a VCO due to resistive loading. This tuning arrangement contrasts with that of a fundamental VCO in which the output (resistive) loading of the VCO manifests itself directly in the tuning circuit by a reduction in the effective capacitance ratio of the varactor. In the second harmonic VCO described herein, the output loading is manifest in the second harmonic portion of the circuit and tuning is performed at the reactively terminated fundamental circuit portion. Although the second harmonic output is transparent to the load, the tuned fundamental is isolated from the load by the conversion loss of the harmonic generating mechanism in the active element 14 of the VCO, and from the output waveguide 94 being cutoff to fundamental frequency. With a Gunn diode as the active element, as was used in the demonstrated second harmonic VCO, second harmonic output is typically 15-20 dB below the fundamental power generating capability and is indicative of the level of isolation between fundamental tuning and second harmonic output loading.

(5) A VCO circuit is used which provides a broadband reactive termination to the tuned fundamental oscillation, the reactive termination being in close proximity to the Gunn diode. The reactive termination is located close to the Gunn diode in order to ensure continuous tuning performance, i.e. no holes or jumps in the tuning characteristic. This is especially important in an ultrawideband VCO since a long intermediate line length (greater than a quarter wave length) can result in a multiplicity of resonance conditions and the potential for tuning discontinuities. The lumped element circuit embodiment with its inherently small circuit element size is well suited for satisfying the criteria of short line length.

(6) Inherently broadband second harmonic output is provided since the second harmonic circuit is untuned. The second harmonic is generated in-situ with fundamental tuning of the Gunn diode and is capacitively coupled to the output port. This is in contrast to the radial mode resonator disc type VCO distributed circuit, J. Ondria, "Wideband Electronically Tunable GaAs Gunn VCO's at W-Band (75-110 GHz)", 1985 IEEE MTT-S Symposium Digest, pp. 375-378. In this latter type circuit, the size of the radial disc and its position above the ground plane are the primary factors that control the frequency of the high Q second harmonic tuned circuit.

(7) A lumped element VCO circuit form is used which can be either a series tuned VCO or a parallel tuned VCO by proper choice of the value of its circuit elements. This fundamental flexibility allows its use in either the series or parallel configuration for optimum performance characteristics. For example, an avalanche diode is best suited to a series tuned circuit, while a Gunn diode is best suited to a parallel tuned circuit, S. Hamilton, "Microwave Oscillator Circuits," Microwave Journal, April 1978, pp. 63-66, and 84. The functional flexibility of the lumped element circuit contrasts with that of a commonly used radial mode resonator disc type second harmonic distributed Gunn oscillator circuit that is difficult to varactor tune in a parallel tuned VCO configuration, H. Barth, "A Wideband, Backshort-Tunable Second Harmonic W-Band Gunn Oscillator," 1981 IEEE MTT-S Symposium Digest, pp. 334-337. The distributed disc type circuit is embedded in a waveguide embodiment that propagates the second harmonic and is cutoff to reactively terminate the fundamental. Since the waveguide is cutoff to energy propagation at fundamental frequency, it is difficult to effectively couple shunt tuning elements to tune the fundamental. By contrast, the basic nature of a lumped element circuit supports the existence of all frequencies. The existence of waveguide modes is prevented. Both the fundamental and second harmonic portions of the lumped element circuit are accessible, and the circuit elements can be chosen to provide for series or parallel tuning of the active element. A separate and distinct waveguide section that is cutoff to fundamental and propagates second harmonic is used to reactively terminate the fundamental. This waveguide section is located very close to the lumped element VCO circuit and is interfaced to it with a short section of coax transmission line 84. By contrast, in the radial mode resonator disc type VCO circuit, Ondria reference, supra, the cutoff output waveguide is not separate and distinct from the VCO circuit due to the completely distributed nature of the circuit.

(8) A broadband VCO circuit is used which provides immunity to the undesirable known effect of load pulling on VCO performance. This effect is manifest as a change in VCO frequency due to the often encountered situation in normal VCO usage of a mismatched output load. This condition is alleviated by the use of an external isolation component (ferrite isolator, buffer amplifier, attenuator) between the VCO and load. The inherent isolation of the second harmonic output from the fundamental tuning circuit by the in-situ harmonic generating mechanism, and the elimination of energy propagation at fundamental frequency in the output waveguide (cutoff to fundamental) provide the immunity to load pulling. The immunity means that an external isolation element can be eliminated in most applications.

(9) A second harmonic VCO is provided with dual output waveguide ports 102 and 104. The output waveguide 94 propagates second harmonic frequency and is cutoff to fundamental. An adjustable or fixed short is used at one of the two output ports for the purpose of optimization of output power level. The short does not affect the tunable fundamental oscillation since the output waveguide is cutoff to fundamental frequency. The VCO output configuration of dual output ports also affords a demonstrated feature that the output power level at the two output ports can be set to be equal or unequal. If a fixed short is located at one port, all the generated VCO power will be available at the other port. If the fixed short is removed, there will be an even split of power at the two output ports. If an iris plate or disc 107 with a central circular aperture 108, FIG. 4, is suitably located at one port, there will be an unequal split of power at the two ports, with the lesser level at the apertured port. The amount of energy transmitted through a circular aperture will increase with the diameter of the aperture. This integral power dividing arrangement eliminates the need for an external directional coupler, with its added size, weight and cost, in an application such as phase locking a VCO where both a low level output to the phase lock electronics and a high level main line output are required. Another application is to provide dual (equal or unequal) outputs for coherent local oscillator drives for dual mixers in a receiver.

As above noted, in prior art wideband millimeter wave VCO technology, there are commercially available varactor tuned distributed circuit (waveguide) type Gunn VCO's with ±2 GHz tuning range in a frequency band centered at 57.5 GHz, "CMW Series Wideband Electronically-Tuned Gunn Oscillators", Central Microwave Company, Maryland Heights, Mo., June 1988. The performance demonstrated with the presently disclosed lumped element VCO is ±10 GHz, a factor of 5 larger than that in the prior art in the same frequency band.

A varactor tuned frequency range of 10% at 94 GHz has also been reported in the prior art with a distributed (waveguide) Gunn VCO circuit using a series tuned second harmonic disc type radial resonator, Ondria reference, supra. By contrast, the demonstrated performance of the presently disclosed parallel tuned lumped element VCO was 35.7% centered at 56 GHz, a factor of 3.6 larger than the reported second harmonic VCO. The performance advantage of the presently disclosed parallel tuned VCO would be larger than 3.6 times had the VCO been series tuned as was the radial disc resonator VCO, Ondria reference, supra. Series tuning is known to give wider band tuning as compared to parallel tuning, D. Cawsey, "Wide Range Tuning of Solid State Microwave Oscillators," IEEE Journal of Solid State Circuits, April 1970, pp. 82–84. The comparative results cited above give evidence of the superiority of the presently disclosed lumped element VCO circuit over the prior art in VCO technology.

A lumped element second harmonic Gunn diode oscillator circuit was disclosed by Leonard D. Cohen in "Varactor Tuned Gunn Oscillators With Wide Tuning Range for the 25 to 75 GHz Frequency Band", IEEE MTT-S International Microwave Symposium, April 1979, Orlando, Fla. The demonstrated performance obtained with the lumped element circuit described in this latter paper was a 10 GHz tuning range, centered at 55 GHz, with an average output power of 0.65 mw (milliwatts) over the tuning band. In addition, a 13 GHz tuning range, center at 64.5 GHz, with an average of 0.24 mw over the band was demonstrated. The performance demonstrated with the presently disclosed lumped element VCO was a tuning range of 20 GHz, centered at 56 GHz, with an average power of 1.9 mw over the band. These latter results show a significant increase in tuning capability and output power over that of the previous lumped element VCO.

The prior art also includes U.S. Pat. No. 4,246,550, entitled "Wideband, Millimeter Wave Frequency Gunn Oscillator."

The innovative features in the presently disclosed VCO that have resulted in significantly enhanced performance compared with U.S. Pat. No. 4,246,550 are as follows.

| Present Disclosure | U.S. Pat. No. 4,246,550 |
| --- | --- |
| The varactor tuned fundamental oscillation is reactively terminated in close proximity to the Gunn diode. Hence, energy circulation at fundamental frequency is limited to a small region of the circuit which translates to lower circuit loss and higher second harmonic output. Measured performance shows up to an 8 times increase in average output power relative to that of second harmonic VCO's without a reactively terminated fundamental ('550 patent). | The varactor tuned fundamental oscillation is not reactively terminated and energy can circulate into the output waveguide section. The output waveguide is not cutoff to fundamental frequency. |
| Output power is obtained from the second harmonic portion of the VCO circuit which is isolated from the varactor tuned fundamental portion of the circuit. The elimination of output (resistive) loading effects from the tuning circuit enhances the tuning range of the VCO. (Resistive loading effects in the tuning circuit would be manifest as a diminished varactor capacitance ratio, and hence a diminished tuning range). Measured tuning range performance with a reactively terminated fundamental was 1.5 times larger than that of a VCO with resistive loading effects. | Output loading effects are present in the varactor tuned fundamental circuit since the output waveguide was not cutoff to fundamental frequency. This diminishes the effective capacitance ratio of the varactor and results in a diminished tuning range. |
| Output waveguide is cutoff to the propagation of energy at fundamental frequen- | Output waveguide can propagate both fundamental and second harmonic energy. |

| Present Disclosure | U.S. Pat. No. 4,246,550 |
|---|---|
| cy. Only second harmonic can propagate. This arrangement isolates the fundamental from the output load and makes the load transparent only to second harmonic. It thereby allows for independent circuit adjustments at fundamental and second harmonic for the realization of optimum tuning and output power performance. | Difficult to obtain optimum performance since output circuit adjustments for maximum output at second harmonic, for example, simultaneously affect the tuning and power generating characteristics of the varactor tuned fundamental. The dissipative loss due to fundamental energy propagation in the output waveguide will be manifest as reduced second harmonic output and reduced tuning range. |
| The varactor tuned fundamental oscillation circuit is isolated from mismatched output loading effects since output is obtained from the in-situ generated second harmonic. This loading effect is known as pulling and would cause VCO frequency to deviate from its intended value with changing load conditions. The immunity to output loading follows from the isolation inherent in the in-situ harmonic generation mechanism in the active element and to the use of a circuit that does not allow propagation of fundamental energy in the output waveguide. This load immunity in the second harmonic VCO translates to the elimination of an external ferrite isolator, buffer amplifier or attenuator at the VCO output in many applications. The use of an isolator, buffer amplifier or attenuator load isolation is mandatory when using a fundamental VCO. | The varactor tuned fundamental oscillation circuit is directly affected by the load and the VCO is subject to load pulling effects. The tuning circuit is transparent to the load. |
| The Gunn and varactor diodes are independently biased* which translates to an additional degree of freedom in circuit design for optimum VCO performance characteristics. No biasing sequence is required. | Gunn and varactor diodes have a common bias connection and are not independently biased. Varactor bias is relative to Gunn bias. A biasing sequence is required in that varactor bias must be applied before Gunn bias is applied, in order to avoid damage to the varactor diode. A turn on sequence is a disadvantage. |

*(It should be noted that in the prior art such as in the Ondria reference, supra, the circuit arrangement used does not allow for independent biasing of the Gunn and varactor diodes. Varactor bias is relative to Gunn bias.)

The presently disclosed VCO is also described in the technical paper entitled "Millimeter Wave, Lumped Element, Gunn VCO's with Ultrasideband (20 GHz) Tuning", L. Cohen and E. Sard, 1989 IEEE-MTT-S International Microwave Symposium, June 13-15, 1989, pp. 1927-1930, incorporated herein, and to which reference is now made.

A new millimeter wave Gunn VCO with ultrawideband tuning has been developed and modeled. The VCO is tuned at its reactively terminated fundamental frequency and output is obtained from the in-situ generated Gunn diode second harmonic. Measured performance includes continuous tuning from 46 to 66 GHz, a 20 GHz tuning range, with a maximum power output of +6 dBm.

Prior art reported results have shown that the intrinsic advantages of a lumped element circuit form can be realized in practice at millimeter wave lengths with oscillators and VCO's, L. D. Cohen and E. Sard, "Recent Advances in the Modelling and Performance of Millimeter Wave InP and GaAs Gunn VCO's and Oscillators", 1987 IEEE-MTT-S International Microwave Symposium Digest, pp. 429-432, and mixers, J. L. Merenda, D. Neuf, P. Piro, "4 to 40 GHz Even Harmonic Schottky Mixer", 1988 IEEE-MTT-S International Microwave Symposium Digest, pp. 695-698. These advantages include broadband, continuous and spurious free performance, circuit loss comparable to that of a waveguide circuit, miniature circuit size, simple circuit topology and greater resolution and accuracy in circuit modelling and performance analysis as compared to commonly used distributed type circuits. The virtues of lumped element circuit technology have been used as the basis for the development of the present ultrabroadband Gunn VCO that is varactor tuned over the 46 to 66 GHz band, a tuning range of 20 GHz. This tuning capability exceeds that of prior art VCO's in this frequency band by a factor of 5. The presently disclosed ultrawideband VCO's can be used for full waveguide band fast tuning drivers, for wideband swept local oscillator receivers, and for instrumentation applications.

New VCO results and technology presented are as follows.

(a) A new lumped element circuit for an ultra-broadband, second harmonic, varactor tuned, Gunn VCO.

(b) A measured continuous tuning range of 20 GHz in a V band (50 to 75 GHz) VCO, which is five times the tuning capability of existing Gunn VCO's in this waveguide band.

(c) A linear tuning range of 9 GHz, which is 45 percent of the total tuning range.

(d) In-situ second harmonic generation in the Gunn diode, eliminating the need for a separate broadband doubler circuit.

(e) Efficient and broadband Gunn diode second harmonic generation by reactively terminating the varactor tuned fundamental oscillation close to the Gunn diode.

(f) Modelling and analysis results of lumped element second harmonic Gunn VCO's, including quantification of the model elements. Excellent agreement has been obtained between the measured and calculated tuning characteristics.

(g) Increased immunity to load pulling as compared to a fundamental output VCO. This translates to the elimination of an output isolator in many applications.

The second harmonic Gunn VCO is designed to varactor tune the Gunn diode at fundamental frequency and to use the in-situ generated Gunn second harmonic as output. The fundamental oscillation is reactively terminated close to the Gunn diode. This has the favorable effect of enhancing the tuning capability of the VCO since the intrinsic diminishing effect on tuning range of resistive loading is eliminated.

A circuit diagram and layout of a second harmonic, lumped element, Gunn VCO for a V band (50 to 75

GHz) VCO is shown in FIGS. 1 and 2. The lumped element concept is based on the use of circuit elements that are sufficiently small that they can be characterized as lumped components. The 0.074 in.×0.074 in. notch into which the lumped element circuit is assembled is sized to be cutoff to waveguide modes in the output frequency range of interest, thereby providing integrity to the lumped element circuit form. The discrete circuit elements include a packaged Gunn diode 14, a hyperabrupt junction GaAs chip varactor 18, and three MIS chip capacitors 44, 54, 88. The inductive elements are the short lengths of line such as 20 that provide the electrical connection between the discrete elements. The Gunn and varactor diode bias chokes 32, 68 are nominally a quarter wavelength long at the center of the output frequency band. The second harmonic output is capacitively coupled at 76 from the circuit and transmitted with coax (0.034 in. outer diameter), center conductor 84, to a WR-15 section of output waveguide 94. The coax center conductor 84 at the waveguide end 26, FIG. 3, of the coax provides a broadband transition from the nominal 50 ohm level of the VCO circuit to the nominal 400 ohm impedance level of the waveguide. The output waveguide is cutoff to the fundamental frequency band which enables the Gunn diode to be reactively terminated in this frequency range.

The equivalent circuit model of the second harmonic Gunn VCO 10 of FIGS. 1 and 2 is shown in FIG. 5, where:

$Z_L$ = Output coax transmission line impedance (50 ohm nominal)

$P_L$ = Length of output coax transmission line (between VCO circuit and output waveguide)

$K_L$ = Dielectric constant of output coax transmission line dielectric (Teflon, typ.)

$Z_B$ = Impedance of varactor diode and Gunn diode bias lines (air dielectric, $K_B = 1$)

$P_B$ = Length of varactor diode and Gunn diode bias lines $C_{PRO}$ = Capitance of probe (coax center conductor end 26)

$L_{WG}$ = Equivalent inductance of output waveguide (94) at fundamental frequency (output waveguide cutoff to fundamental frequency)

$C_L$ = Output coupling capacitance $C_D$ = Gunn diode domain capacitance $R_Q$ = Gunn diode low field (dissipat $L_P$ = Gunn diode package inductance $C_P$ = Gunn diode package capacitance $C_{IF}$ = DC blocking and varactor decoupling capacitance $L_T$ = Tuning inductance $R_T$ = Tuning circuit resistance (includes varactor resistance)

$C_T$ = Varactor capacitance

The model includes the coax line 84 ($Z_L$, $P_L$, $K_L$) from the Gunn diode 14 to the output waveguide section and the Gunn and varactor bias lines 24, 22 ($Z_B$, $P_B$, 1). Each bias choke is a thin wire above ground ($K_B = 1$, where $K_B$ is the dielectric constant of air). The circuit elements in the model were quantified in the manner described in L. D. Cohen and E. Sard, "Recent Advances in the Modelling and Performance of Millimeter Wave InP and GaAs VCO's and Oscillators", 1987 IEEE-MTT-S International Microwave Symposium Digest, pp. 429-432. The calculated tuning characteristic of an InP Gunn VCO, based on the quantified model, is shown in FIG. 6 and compared to the measured characteristic, where $V_G$ is Gunn diode bias voltage, and $I_G$ is Gunn diode bias current. The tuning characteristics are in close agreement, the maximum frequency difference being 0.6 percent. The tuning and output characteristics of the VCO are shown in FIG. 7. For these measurements, a fixed short was used at one of the output ports and was set for maximum tuning range. The other port at flange 102 was the output port of the VCO. The VCO tuned from 46.4 to 64.7 GHz, an 18.3 GHz tuning range, with a maximum tuning voltage of −30 volts. Linear tuning was exhibited over a 9 GHz tuning range, from 48.7 to 57.7 GHz, with a corresponding tuning range voltage of −4 to −12 volts. An additional 1.2 GHz of tuning was obtained with an increase of tuning voltage to −46 volts. Zero varactor current was observed over the full tuning range. The power dip at the high frequency end of the band was due to an oversized circuit cutout that was not cutoff to waveguide modes in this region of the tuning band. The power dip at the low end of the band is expected to be eliminated with a shorter length of coax 84 between the VCO circuit and its waveguide output. Up to 2 GHz of additional tuning at the low end of the band is expected with a DC blocking capacitor 54 of higher value than the 1.5 pF (picofarad) capacitor used. The 1.5 pF blocking capacitor was comparable to the 1.95 pF zero bias capacitance of the hyperabrupt junction tuning varactor. Hence, the tuning range and linearity at the low end of the band in the data shown in FIG. 7 was diminished by the padding of the varactor capacitance by capacitor 54.

An ultrabroadband millimeter wave VCO has been described. The VCO is varactor tuned at fundamental frequency and output is obtained from the in-situ generated Gunn diode second harmonic. Inherently broadband tuning capability is provided by the use of a lumped element circuit form, reactively terminating the varactor tuned fundamental oscillation band, and the use of the in-situ generated Gunn diode second harmonic as output. Measured performance includes continuous VCO tuning from 46 to 66 GHz, a 20 GHz tuning range, with maximum power output of +6 dBm. This tuning capability exceeds that of prior art Gunn VCO's in this frequency band by a factor of five. It is projected that the VCO technology can be extended to provide full waveguide band VCO's into at least V band (50 to 75 GHz).

Prior art VCO's exhibit up to octave range tuning capability in the microwave band (to 18 GHz). For example, frequency coverage of the microwave band is available with commercial VCO's having tuning ranges of 1 to 2 GHz, 2 to 4 GHz, 4 to 8 GHz, 8 to 12 GHz, and 12.4 to 18 GHz, Avantek Product Guide Catalog, 1987, page 67. Thus, five VCO's are required to cover the microwave band from 1 to 18 GHz. In addition, these VCO's would require a switching arrangement to establish the composite microwave band coverage.

With the use of the present ultrabroadband millimeter wave VCO, a frequency range greater than 1 to 18 GHz can be covered with only one VCO, and several ancillary components. Accordingly, this latter arrangement provides full microwave band coverage with fewer components, lower cost, smaller size, lower power consumption and shorter tuning time than previously possible with the multiplicity of VCO's that otherwise need to be used. The shorter tuning time results from the elimination of the switches, and their switching times, that are associated with an arrangement that uses a multiplicity of VCO's.

Figure 8:
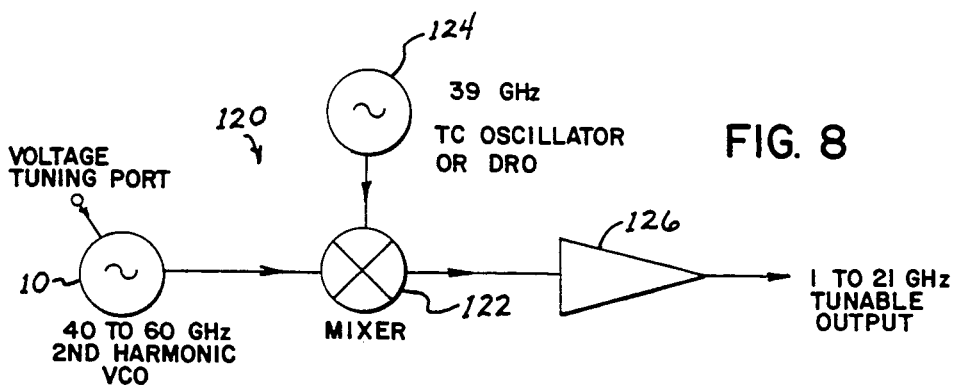
FIG. 8 shows a multi-octave microwave VCO system.

A block diagram of a new multi-octave microwave VCO system 120 is shown in FIG. 8, using the ultra-broadband 40 to 60 GHz second harmonic type VCO 10 above described. The 40 to 60 GHz output of VCO 10 is downconverted at mixer 122 with a stable 39 GHz local oscillator 124 which translates the 20 GHz tuning range of the VCO to a 1 to 2; GHz output. The stable local oscillator is a DRO (dielectric resonator oscillator), or a temperature compensated oscillator as shown in U.S. Pat. No. 4,728,907. The output amplifier 126 is optional and would be used when an increased output power level is required. With the arrangement shown in FIG. 8, voltage tuning of the 40 to 60 GHz VCO results in a 1 to 21 GHz down converted output that follows the tuning of the VCO. As noted above, the conventional use of an isolator between the VCO and the mixer is not required with the second harmonic VCO, and is a consequence of the inherent isolation of the tuning circuit of the VCO from the load (mixer). By the appropriate choice of local oscillator frequency, the 20 GHz tuning range of the 40 to 60 GHz VCO can be translated by the mixer to a 20 GHz wide output frequency band other than the 1 to 21 GHz shown in FIG. 8. For example, with a 34 GHz local oscillator, the translated output frequency would be 6 to 26 GHz.

The measured tuning characteristic of a microwave multi-octave (1 to 19 GHz) VCO, of the form described in FIG. 8, is shown in FIG. 10. The millimeter wave VCO that was downconverted had a tuning range of 6.6 to 64.6 GHz, an 18 GHz tuning band. The local oscillator drive to the mixer was provided by a 45.69 GHz lumped element oscillator. The resulting down converted mixer output was 1 to 19 GHz as shown in FIG. 10.

Figure 9:
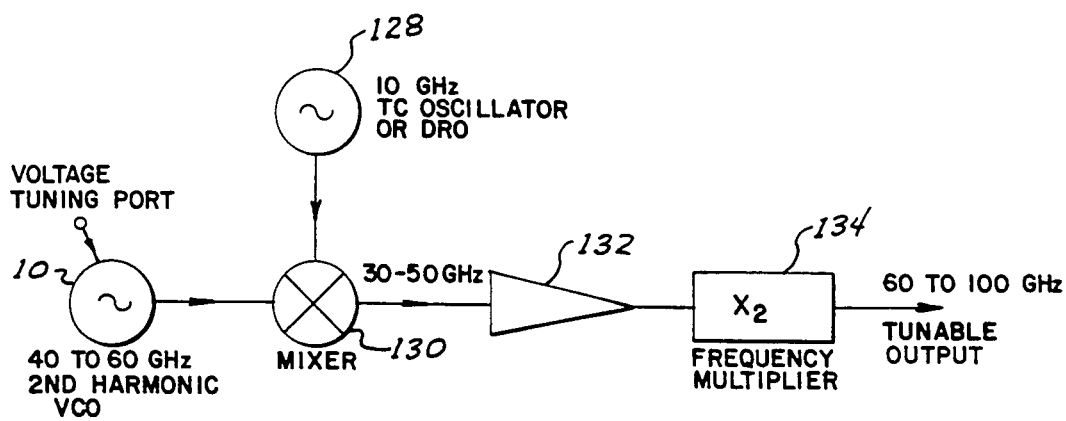
FIG. 9 shows a frequency enhanced ultrawideband millimeter wave VCO system.

Another application of the above described second harmonic VCO 10 is shown in FIG. 9. In this application, a local oscillator 128 with a significantly lower local oscillator frequency of 10 GHz is used for the down conversion at mixer 130. The 40 to 60 GHz output of the VCO is down converted to the 30 to 50 GHz band. The down converted 20 GHz wide output is amplified at amplifier 132 and frequency multiplied by 2 at multiplier 134 to produce a 60 to 100 GHz output. The 20 GHz wide tuning band of the 40 to 60 GHz VCO has been increased to a 40 GHz wide band in the 60 to 100 GHz range. This range exceeds the 60 to 90 GHz band coverage of WR-12 waveguide that is the standard for use in this frequency region and exemplifies the extreme tuning range of the VCO system. The VCO arrangement in FIG. 9 illustrates a means to enhance the frequency tuning capability of the basic ultra-wideband VCO 10. Frequency multipliers and amplifiers are known technologies, but the use of a single ultra-wideband VCO as a drive source gives practicality to the realization of such ultrawideband VCO systems. The ability to provide more than full waveguide band tunable frequency coverage at short millimeter wavelengths has heretofore been impractical due to the complexity incurred if a multiplicity of drive sources are to be used. In a further embodiment of FIG. 9, local oscillator 128 and mixer 130 are omitted, and the output of VCO 10 is supplied directly to amplifier 132, and the 20 GHz wide tuning band of the 40 to 60 GHz VCO is increased to a 40 GHz wide band in the 80 to 120 GHz range at the output of multiplier 134.

PRESENT INVENTION

The present invention arose during continuing development efforts relating to the above described subject matter and directed toward reducing phase noise. The description of a new technique for reduction of the phase noise of a fixed frequency oscillator or widely tunable oscillator (VCO), analytical considerations and a circuit embodiment that was used to successfully demonstrate the technique is presented in the following sections. The technique is based on the enhancement of the external Q of an oscillator or VCO by operating in a two frequency mode. In a second harmonic mode, for example, the fundamental oscillation is reactively terminated and isolated from the load by a high-pass filter. Output power is obtained from the in-situ generated second harmonic of the fundamental. The fundamental oscillation circuit is isolated from second harmonic loading by the intrinsic isolation associated with the in-situ second harmonic generating mechanism in the active element, i.e. Gunn diode. Since the fundamental oscillation circuit is reactively terminated by a large reactance in close proximity to the active (negative resistance) element in the oscillator circuit, the energy stored in the oscillator circuit can be large compared to the level of energy delivered to the load at second harmonic. Hence, the external Q of the fundamental oscillation circuit will be more than an order of magnitude larger than a conventional fundamental oscillator that is loaded directly at fundamental frequency. For example, measured performance shows that the external Q of a second harmonic oscillator is approximately 600 whereas the external Q of an oscillator that is loaded at fundamental frequency is approximately 25. Hence, by using the second harmonic mode, the external Q was enhanced by a factor of 24 which translates to a phase noise reduction of 25 dB. The Q enhancement technique is also applicable to the use of third or a higher order harmonic for output. The technique is broadband since the reactive terminal (high-pass filter) is broadband. The technique provides continuous noise reduction over the full tuning range of a VCO without any circuit adjustment.

The parameters of a negative resistance oscillator that define its frequency modulation (phase) noise and its amplitude modulation noise are given in, "FM and AM Noise in Microwave Oscillators", S. Hamilton, Microwave Journal, June 1978, pp. 105-109, $$\text{FM CASE:} \frac{N}{C} = \frac{1}{2} \frac{MkT_oB}{P_o} \left[ \frac{f_o}{Q_{ext}f_m} \right]^2 \quad (1)$$

$$\text{AM CASE:} \frac{N}{C} = \frac{1}{2} \frac{MkT_oB}{P_o} \left[ \frac{1}{\left(\frac{S}{2}\right)^2 + \left(\frac{Q_{ext}f_m}{f_o}\right)^2} \right] \quad (2)$$

These expressions give the FM and AM noise power as a single sideband noise to carrier power ratio N/C. The noise power is integrated over a frequency band B (Hz) that is spaced at a frequency $f_m$ away from a carrier $f_o$ on one side of the carrier. The factor M is the noise measure of the device and typical values for Gunn and avalanche diodes are 25 and 35 dB, respectively. The term $kT_oB$ is thermal noise power in a bandwidth B, $P_o$ is output power and the factor S, in the AM case, relates to a device operating condition and has a value of 2 at maximum output power. These expressions give both quantitative and qualitative insight into the understanding of the noise suppression technique disclosed herein. The disclosed noise reduction technique is applicable to both the FM and AM noise of an oscillator or VCO. The discussion to follow emphasizes FM noise power which is significantly higher than AM noise power in almost all microwave and millimeter wave oscillators and VCO's of interest for system applications, "FM and AM Noise in Microwave Oscillators", S. Hamilton, Microwave Journal, June 1978, pp. 105-109. For example, a Gunn oscillator in $K_A$ band (26 to 40 GHz) has an AM noise to carrier power ratio of $-130$ to $-160$ dBc/Hz compared to an FM noise power of $-120$ dBc/Hz at a 1 MHz offset frequency.

The expression for frequency modulation (phase) noise given by equation 1 shows that control of the external Q of the oscillator or VCO provides a significant means by which the phase noise of an oscillator or VCO can be impacted. FM noise and phase noise can be discussed interchangeably since the two are related by $\theta_d = \Delta f_{peak}/f_m$ where $\theta_d$ is the peak phase deviation and $\Delta f_{peak}$ is the peak frequency deviation. The single sideband to carrier ratio (dB) is $$\frac{N}{C} = 10 \log_{10} \left( \frac{\theta_d}{2} \right)^2 \quad (3)$$

or $$\frac{N}{C} = 10 \log_{10} \left( \frac{\Delta f_{peak}}{2 f_m} \right)^2 \quad (4)$$

With the disclosed technique, the external Q of a VCO was increased to a measured value of 585 as compared to a value of 24.7 for a VCO without enhancement. The enhancement corresponds to an improvement factor of 23.6. From equation 1 it follows that the phase noise reduction would be $10 \log (23.6)^2 = 27.4$ dB. The noise reduction technique was reduced to practice with a Gunn VCO built in lumped element circuit form. The measured noise of Gunn VCO's at 61 GHz with and without $Q_{ext}$ enhancement, is shown in FIG. 11. The measured phase noise of the $Q_{ext}$ enhanced Gunn VCO over the offset frequency range of 80 KHz to 1 MHz, was 26 to 28 dB lower than that of a 61 GHz Gunn VCO that was not $Q_{ext}$ enhanced. The measured improvement is in good agreement with the calculated improvement of 27.4 dB based on the values of $Q_{ext}$ of the respective VCO's and gives validity to the basis of the noise reduction technique.

A calculation of the noise measure, M, of the $Q_{ext}$ enhanced Gunn VCO was made to determine that the value was normal for the Gunn diode used. A rearrangement of equation 1 gives $$M = \frac{2P_o \frac{N}{C}}{kT_o B} \left[ \frac{Q_{ext} f_m}{f_o} \right]^2 \quad (5)$$

The measured parameters of the $Q_{ext}$ enhanced VCO were as follows:

$Q_{ext} = 584$ $P_o = +6$ dBm $f_o = 61$ GHz $f_m = 1$ MHz $N/C = -118$ dBc/Hz $KT_o B = -174$ dBm/Hz The calculated value of M is 24.7 dB which is typical for a Gunn diode. It gives further validity to the disclosed noise reduction technique since it shows that the Gunn diode used in the VCO did not exhibit an anomalously low value of phase noise. The validity of noise reduction by Q enhancement was further established by comparing the measured pushing factors $(\Delta f_o / \Delta V)_{Gunn\ bias}$ of the VCO's with and without Q enhancement. From the ratio of the pushing factors and the measured value of 584 for the $Q_{ext}$ of the Q enhanced VCO, the $Q_{ext}$ of the VCO without Q enhancement was calculated to be 24. This is in close agreement with the value of 24.7 for this VCO.

The disclosed phase noise reduction technique in a fixed frequency or voltage tunable oscillator (VCO) is based on the enhancement of the Q factor of an Oscillator or VCO in a non-conventional manner that provides the technique with broadband RF properties, i.e. over the broad tuning range of a VCO. Its frequency range of application is primarily in the microwave and millimeter wave frequency ranges where it is difficult to achieve high Q factors in oscillators and VCO's. Q factor is a primary determinator of the noise properties of the oscillator or VCO.

It is known that the spectrum of an oscillator can be improved by use of a sufficiently narrow bandpass filter which removes existing phase and amplitude noise. The Q factor of the filter relative to that of the basic oscillator is an important parameter and determines its stabilizing effect on the oscillator. The stabilizing factor (S) is given by $$S = 1 + \frac{Q_{cavity}}{Q_{osc}} \quad (6)$$

The high Q of the auxiliary filter or cavity results in narrowband performance and makes it unsuitable for use over the broadly tunable frequency range of a VCO. It also adds size, cost and weight to an oscillator to which it is added. In addition, it introduces insertion loss and decreases the oscillator output by an amount that depends on the stabilization factor. Insertion loss increases with stabilization factor.

The use of phase or injection locking will reduce the close in phase noise of an oscillator, but the phase noise far from the carrier will be the phase noise of the free running oscillator. Phase or injection locking is complex and adds significant cost, size and weight to the oscillator. Significantly more complexity and cost is added if the locking system need be tunable. A tunable locked system is piece-wise rather than fully continuous.

The disclosed noise reduction technique does not use a cavity or bandpass filter or any of the principles of phase or injection locking. It is a two frequency system, a fundamental that is tuned and a higher order harmonic that is used for output. The Q enhancement technique does not use a band-pass filter or cavity as conventionally used for noise suppression but rather it uses a high-pass filter which is easier to realize and practical at millimeter wave frequencies. By contrast to the conventional filter or cavity technique, it has broadband properties and is not a frequency determining element of the stabilized oscillator. The function of the high-pass filter is twofold. First, it acts as a large reactive load to the tunable fundamental oscillation and constructively reflects energy at fundamental frequency, thereby increasing the external Q of the oscillation circuit. Secondly, the high-pass filter functions to isolate the energy generated at fundamental frequency from the output load. Output to the load is obtained from the in-situ generated Nth harmonic of the tunable fundamental and the harmonic output is inherently isolated from the fundamental by the harmonic generating mechanism in the active element (i.e. 10 to 15 dB at second harmonic with a Gunn diode).

The noise reduction technique is reduced to practice with a V band (50 to 75 GHz) broadband, varactor tuned, lumped element Gunn VCO. The following description of this VCO is intended to illustrate the details of the implementation and to show its effectiveness in phase noise reduction. The implementation of the technique is not limited to the lumped element circuit form used but can be used with various other circuit forms such as printed microstrip, suspended stripline substrate, etc. It is also not limited to the use of a Gunn diode as the active element but can also be used with other active device types such as an Impatt diode or transistors (FET, Bipolar, HEMT, etc).

The VCO was designed as a two frequency oscillator. It was varactor tuned at fundamental frequency and output was obtained from the in-situ generated second harmonic. The fundamental oscillation was loaded by the large reactance presented to it by a high-pass filter (a section of WR-15 waveguide cutoff to fundamental) in close proximity to the Gunn diode. The effect of the filter was to constructively reflect energy back to the fundamental oscillation circuit and thereby enhance its external Q. The tunable fundamental was isolated from the load by the high-pass filter, which cutoff the fundamental and passed second harmonic to the load, and by the intrinsic isolation (10 to 15 dB) of the second harmonic generating mechanism in the Gunn diode. In a lumped element circuit, the high-pass filter could alternately be realized with discrete capacitors and inductors of appropriate value from known design procedures. In a printed circuit form, i.e. microstrip or suspended stripline, a printed high-pass filter can be realized by known design procedures.

The circuit diagram and layout of a second harmonic, lumped element, Gunn VCO for V band (50 to 75 GHz) are shown in FIGS. 1 and 2. The lumped element concept is based on the use of circuit elements that are sufficiently small that they can be characterized as lumped components. The 0.074 in. ×0.074 in. notch into which the lumped element circuit is assembled is sized to be cutoff to waveguide modes in the output frequency range of interest, thereby providing integrity to the lumped element circuit form. The discrete circuit elements consist of a packaged Gunn diode, a hyperabrupt junction GaAs chip varactor, and three MIS chip capacitors. The inductive elements are the short lengths of line that provide the electrical connection between the discrete elements. The Gunn and varactor diode bias chokes are nominally a quarter wavelength long at the center of the output frequency band. The second harmonic output is capacitively coupled from the circuit and transmitted to a WR-15 section of output waveguide by means of the small coax (0.034 in. OD) shown in FIGS. 2 and 3. The coax center conductor at the waveguide end of the coax is designed to provide a broadband transition from the nominal 50 ohm level of the VCO circuit to the nominal 400 ohm impedance level of waveguide. The output waveguide is cutoff to the fundamental frequency band which enables the Gunn diode to be reactively terminated in this frequency range. The output waveguide functions as a high-pass filter. Constructional detail of the coax to waveguide transition and output waveguide is shown in the assembly drawing of the VCO in FIG. 3.

The circuit model of the second harmonic Gunn VCO is shown in FIG. 5, including the coax line ($Z_L$, $P_L$, $K_L$) from the Gunn diode to the output waveguide section and the Gunn and varactor bias lines ($Z_B$, $P_B$, 1). Each bias choke is a thin wire above ground ($K_B=1$). Z is the line impedance, P is line length and K is the dielectric constant of the line medium.

The tuning and output power characteristics of the VCO are shown in FIG. 7. For these measurements, a fixed short was used at one of the output ports and was set for maximum VCO tuning range. The VCO tuned from 46.4 to 64.7 GHz, an 18.3 GHz tuning range, with a maximum tuning voltage of −30 volts. Zero varactor current was observed over the full tuning range.

The external Q of the Q enhanced VCO was measured by the known pulling method, "Loaded Q Factor Measurements on Gunn Oscillators", Warner & Hobson, Microwave Journal, Feb. 1970. At 61 GHz, the measured Q was 584. This compares to a value of 24.7 for a VCO without Q enhancement. The enhancement technique increased the external Q of the VCO by a factor of 23.6.

Phase noise at 61 GHz was measured by the known direct spectrum analyzer method which is valid since the AM noise of a Gunn oscillator is known to be at least 10 dB less than its phase noise. The phase noise measurements are shown plotted in FIG. 11 and compared to the phase noise of a lumped element Gunn VCO without Q enhancement. With Q enhancement, the phase noise of the VCO was 26 to 28 dB lower than the phase noise of a VCO without Q enhancement, over the offset frequency range of 80 KHz to 1 MHz.

It is recognized that various equivalents, alternatives and modifications are possible within the scope of the appended claims. The resonator circuit 16 may be a fixed resonator circuit, to provide a fixed frequency oscillator, or may be a tuning circuit, e.g. with varactor 18, to provide a VCO.

I claim:

1. A method for reducing phase noise in an oscillator operational in the millimeter wave and microwave range, comprising providing a lumped element active circuit including an active element with a negative resistance, providing a lumped element resonator circuit coupled to said active circuit and affording resonant circuitry in combination therewith, reducing phase noise by enhancing Q of said resonant circuitry by reactively terminating fundamental frequency oscillation and increasing stored fundamental frequency energy in said resonant circuitry.

2. The method according to claim 1 comprising reactively terminating fundamental frequency oscillation with sufficiently high reactance such that said resonant circuitry is the prime energy storing and frequency determining circuit.

3. The method according to claim 1 comprising providing means reactively terminating fundamental frequency oscillation with sufficiently high reactance such that said resonant circuitry is the prime energy storing and frequency determining circuit and such that said means reactively terminating fundamental frequency oscillation is not an oscillation frequency determining element nor a substantial energy storing element.

4. The method according to claim 2 comprising providing said resonator circuit with a tuning circuit, and comprising providing broadband reactive termination of fundamental frequency oscillation, and providing Q enhancement and phase noise reduction over the full tuning range of said oscillator.

5. The method according to claim 1 comprising reactively terminating fundamental frequency oscillation by high pass filtering to separate fundamental frequency from a higher order harmonic at least as high as the second order, and passing said higher order harmonic to provide an oscillator output.

6. A method for reducing phase noise in an oscillator operational in the millimeter wave and microwave range, comprising providing a lumped element active circuit including an active element with a negative resistance, providing a lumped element resonator circuit coupled to said active circuit and affording resonant circuitry in combination therewith, reducing phase noise by enhancing Q of said resonant circuitry by operating said oscillator in a two frequency mode by providing a high pass filter closely coupled to said active circuit and reactively terminating fundamental frequency oscillation and preventing propagation of fundamental frequency energy beyond said active circuit, and passing a higher order output harmonic at least as high as the second order to an output load and isolating fundamental frequency energy from said load.

7. The method according to claim 6 comprising generating said higher order harmonic in-situ in said active element, obtaining output power from said higher order harmonic generated in-situ in said active element, isolating fundamental frequency energy from said higher order harmonic output to said load by in-situ harmonic generation in said active element, providing said high pass filter with sufficiently large reactance to fundamental frequency such that the energy stored in said resonant circuitry is large compared to the energy delivered to said load at said higher order harmonic such that Q of said resonant circuitry at fundamental frequency is more than an order of magnitude larger than the Q of an oscillator loaded at fundamental frequency and delivering energy to a load at fundamental frequency.

8. The method according to claim 6 comprising providing said resonator circuit with a tuning circuit, and providing broadband reactive termination with said high pass filter and continuous phase noise reduction over the full tuning range of the oscillator without circuit adjustment.

9. A method for reducing phase noise in an oscillator operational in the millimeter wave and microwave range, comprising providing a lumped element active circuit including an active element with a negative resistance, providing a lumped element resonator circuit coupled to said active circuit and affording resonant circuitry in combination therewith, providing a high pass filter closely coupled to said active circuit to prevent propagation of fundamental frequency energy beyond said active circuit to an output load, and to provide an oscillator output passing a higher order output harmonic at least as high as the second order, using said closely coupled high pass filter to limit energy circulation at fundamental frequency to the region of said active circuit to circulate fundamental frequency energy back to said active element to generate more higher order harmonic energy, to provide a two frequency system, including a fundamental frequency, and a higher order harmonic at the oscillator output, using said high pass filter to perform dual functions of (a) providing a large reactive load to the fundamental oscillation and constructively reflecting energy at fundamental frequency to generate more higher order harmonic energy, increase Q of said resonant circuitry and reduce phase noise, and (b) isolating the energy generated at fundamental frequency from the output load.

10. The method according to claim 9 comprising providing said resonator circuit with a tuning circuit, and tuning said fundamental frequency.

11. A method for reducing phase noise in an oscillator operational in the millimeter wave and microwave range, comprising providing a lumped element active circuit including an active element with a negative resistance, providing a lumped element resonator circuit coupled to said active circuit and affording resonant circuitry in combination therewith, providing an output waveguide coupled to said resonant circuitry and cutoff at the fundamental frequency of oscillation and constructively reflecting energy back to said resonant circuitry to enhance Q and reduce phase noise and passing a higher order harmonic at least as high as the second order to provide a resistively loaded oscillator output at said higher order harmonic.

12. The method according to claim 11 comprising providing reactive termination of fundamental frequency energy, generating said higher order harmonic in-situ in said active element, isolating said fundamental frequency from said resistive loading of said output waveguide by harmonic generation in said active element, and increasing stored fundamental frequency energy in said resonant circuitry by said reactive termination of fundamental frequency energy and providing a two frequency system including said fundamental frequency and said higher order harmonic which is output through said waveguide.

13. The method according to claim 12 comprising providing said resonator circuit with a tuning circuit, and tuning said fundamental frequency.

14. An oscillator operational in the millimeter wave and microwave range, comprising a lumped element active circuit including an active element with a negative resistance, a lumped element resonator circuit coupled to said active circuit and providing resonant circuitry in combination therewith, means for reducing phase noise by enhancing Q of said resonant circuitry comprising means reactively terminating fundamental frequency oscillation and increasing stored fundamental frequency energy in said resonant circuitry.

15. The oscillator according to claim 14 wherein said means reactively terminating fundamental frequency has sufficiently high reactance such that said resonant circuitry is the prime energy storing and frequency determining circuit and such that said means reactively terminating fundamental frequency oscillation is not an oscillation frequency determining element nor a substantial energy storing element.

16. The oscillator according to claim 14 wherein said resonator circuit comprises a tuning circuit, and wherein reactive termination of fundamental frequency oscillation is broadband, and Q enhancement and phase noise reduction is over the full tuning range of said oscillator.

17. The oscillator according to claim 14 wherein said means reactively terminating fundamental frequency oscillation comprises a high pass filter separating fundamental frequency from a higher order harmonic at least as high as the second order, and passing said higher order harmonic to provide an oscillator output.

18. An oscillator operational in the millimeter wave and microwave range, comprising a lumped element active circuit including an active element with a negative resistance, a lumped element resonator circuit coupled to said active circuit and providing resonant circuitry in combination therewith, means for reducing phase noise by enhancing Q of said resonant circuitry comprising means operating said oscillator in a two frequency mode comprising a high pass filter closely coupled to said active circuit and reactively terminating fundamental frequency oscillation and preventing propagation of fundamental frequency energy beyond said active circuit, and passing a higher order output harmonic at least as high as the second order to an output load and isolating fundamental frequency energy from said load.

19. The oscillator according to claim 18 wherein:
said higher order harmonic is generated in-situ in said active element;
output power is obtained from said higher order harmonic generated in-situ in said active element;
said fundamental frequency is isolated from said higher order harmonic output to said load by said in-situ harmonic generation in said active element;
the reactance of said high pass filter to said
y is sufficiently large such that the fundamental frequency energy stored in said resonant circuitry is large compared to the energy delivered to said load at said higher order harmonic such that Q of said resonant circuitry at fundamental frequency is more than an order of magnitude larger than the Q of an oscillator loaded at fundamental frequency and delivering energy to a load at fundamental frequency.

20. The oscillator according to claim 18 wherein said resonator circuit comprises a tuning circuit, and said high pass filter providing reactive termination is broadband and provides continuous phase noise reduction over the full tuning range of the oscillator without circuit adjustment.

21. An oscillator operational in the millimeter wave and microwave range, comprising a lumped element active circuit including an active element with a negative resistance, a lumped element resonator circuit coupled to said active circuit and providing resonant circuitry in combination therewith, a high pass filter closely coupled to said active circuit to prevent propagation of fundamental frequency energy beyond said active circuit to an output load, and to provide an oscillator output passing a higher order output harmonic at least as high as the second order, said closely coupled high pass filter limiting energy circulation at fundamental frequency to the region of said active circuit to circulate fundamental frequency energy back to said active element to generate more higher order harmonic energy, said high pass filter providing a two frequency system, including a fundamental frequency, and a higher order harmonic at the oscillator output, said high pass filter performing the dual functions of (a) providing a large reactive load to the fundamental oscillation and constructively reflecting energy at fundamental frequency to generate more higher order harmonic energy, increase Q of said resonant circuitry and reduce phase noise, and (b) isolating the energy generated at fundamental frequency from the output load.

22. The oscillator according to claim 21 wherein said resonator circuit comprises a tuning circuit, and wherein said fundamental frequency is tuned.

23. An oscillator operational in the millimeter wave and microwave range, comprising an active circuit including an active element with a negative resistance, a resonator circuit coupled to said active circuit and providing resonant circuitry in combination therewith, an output waveguide coupled to said resonant circuitry and cut-off at the fundamental frequency of oscillation to constructively reflect energy back to said resonant circuitry to enhance Q and reduce phase noise, said waveguide passing a higher order harmonic at least as high as the second order to provide a resistively loaded oscillator output at said higher order harmonic.

24. The oscillator according to claim 23 wherein said higher order harmonic is generated in-situ in said active element, said fundamental frequency is isolated from said resistive loading of said output waveguide by harmonic generation in said active element, and said reactive termination of fundamental frequency energy increases stored fundamental frequency energy in said resonant circuitry and provides a two frequency system including said fundamental frequency and said higher order harmonic which is output through said waveguide.

25. The oscillator according to claim 24 wherein said resonator circuit comprises a tuning circuit, and said fundamental frequency is tuned.

26. A varactor tuned oscillator, VCO, operational in the millimeter wave and microwave range, comprising:
a lumped element active circuit including an active element with a negative resistance;
a lumped element tuning circuit coupled to said active circuit and providing resonant circuitry in combination therewith;
means for reducing phase noise by enhancing Q of said resonant circuitry comprising a high pass filter closely coupled to said active circuit to prevent propagation of fundamental frequency energy beyond said active circuit and to provide a VCO output reactively terminated at the fundamental frequency of oscillation and resistively loaded at a higher order harmonic at least as high as the second order, said high pass filter constructively reflecting fundamental frequency energy back to said resonant circuitry and increasing stored fundamental frequency energy in said resonant circuitry to generate more higher order harmonic energy, and also isolating fundamental frequency energy from the VCO output;
a first bias port for varactor tuning;
a second bias port for biasing said active element;
a first quarter wave choke at $\leq$ said higher order harmonic having first and second terminals, said first terminal of said choke being coupled to said first bias port;
a second quarter wave choke at $\leq$ said higher order harmonic having first and second terminals, said first terminal of said second choke being coupled to said second bias port;

said tuning circuit having first and second terminals, said first terminal of said tuning circuit being coupled to said second terminal of said first choke;

said active circuit having first and second terminals, said first terminal of said active circuit being coupled to said second terminal of said second choke and to said first terminal of said tuning circuit and to said VCO output, said second terminal of said active circuit being coupled to said second terminal of said tuning circuit;

said high pass filter providing a load circuit coupled to said VCO output at said first terminal of said active circuit, said load circuit reactively terminating said VCO output at said fundamental frequency and resistively loading said VCO output at said higher order harmonic and passing said higher order harmonic;

a first capacitor having first and second terminals, said first terminal of said first capacitor being connected to a node between said first bias port and said first terminal of said first choke, said second terminal of said first capacitor being connected to said second terminal of said tuning circuit;

a second capacitor having first and second terminals, said first terminal of said second capacitor being connected to a node between said second terminal of said first choke and said first terminal of said tuning circuit, said second terminal of said second capacitor being connected to a node between said second terminal of said second choke and said first terminal of said active circuit;

a third capacitor having first and second terminals, said first terminal of said third capacitor being connected to a node between said second terminal of said second choke and said first terminal of said active circuit, said second terminal of said third capacitor being coupled to said load circuit;

a fourth capacitor having first and second terminals, said first terminal of said fourth capacitor being connected to a node between said second bias port and said first terminal of said second choke, said second terminal of said fourth capacitor being connected to said second terminal of said active circuit.

* * * * *